United States Patent
Blackwell et al.

(10) Patent No.: US 11,217,456 B2
(45) Date of Patent: Jan. 4, 2022

(54) SELECTIVE ETCHING AND CONTROLLED ATOMIC LAYER ETCHING OF TRANSITION METAL OXIDE FILMS FOR DEVICE FABRICATION

(71) Applicant: Intel Corporation, Santa Clara, CA (US)

(72) Inventors: James M. Blackwell, Portland, OR (US); Scott B. Clendenning, Portland, OR (US); Cen Tan, Beaverton, OR (US); Marie Krysak, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 30 days.

(21) Appl. No.: 16/955,012

(22) PCT Filed: Mar. 26, 2018

(86) PCT No.: PCT/US2018/024294
§ 371 (c)(1),
(2) Date: Jun. 17, 2020

(87) PCT Pub. No.: WO2019/190453
PCT Pub. Date: Oct. 3, 2019

(65) Prior Publication Data
US 2020/0395223 A1   Dec. 17, 2020

(51) Int. Cl.
*H01L 21/311* (2006.01)
*H01L 21/768* (2006.01)
(Continued)

(52) U.S. Cl.
CPC .. *H01L 21/31122* (2013.01); *H01L 21/31144* (2013.01); *H01L 21/76897* (2013.01);
(Continued)

(58) Field of Classification Search
CPC ......... H01L 21/31122; H01L 21/31144; H01L 21/76897; H01L 21/823431;
(Continued)

(56) References Cited

U.S. PATENT DOCUMENTS 9,105,925 B2 * 8/2015 Kim ...................... H01M 4/485
2016/0064152 A1   3/2016 Gardner et al.
(Continued)

FOREIGN PATENT DOCUMENTS

JP   2010-016014   1/2010

OTHER PUBLICATIONS

International Search Report and Written Opinion for International Patent Application No. PCT/US2018/024294 dated Dec. 17, 2018, 9 pgs.

(Continued)

*Primary Examiner* — Karen Kusumakar
(74) *Attorney, Agent, or Firm* — Schwabe, Williamson & Wyatt, P.C.

(57) ABSTRACT

Selective etching and controlled atomic layer etching of transition metal oxide films for device fabrication, and the resulting devices, are described. In an example, method of dry etching a film includes forming a transition metal oxide film having a latent pore-forming material therein. The method also includes removing a surface portion of the latent pore-forming material of the transition metal oxide film to form a porous region of the transition metal oxide film. The method also includes removing the porous region of the transition metal oxide film.

24 Claims, 9 Drawing Sheets

(51) Int. Cl.
    *H01L 21/8234* (2006.01)
    *H01L 23/522* (2006.01)
    *H01L 23/532* (2006.01)
    *H01L 27/088* (2006.01)
    *H01L 29/66* (2006.01)
    *H01L 29/78* (2006.01)

(52) U.S. Cl.
    CPC .. *H01L 21/823431* (2013.01); *H01L 23/5226* (2013.01); *H01L 23/5329* (2013.01); *H01L 27/0886* (2013.01); *H01L 29/66795* (2013.01); *H01L 29/785* (2013.01)

(58) Field of Classification Search
    CPC ............. H01L 23/5226; H01L 23/5329; H01L 27/0886; H01L 29/66795; H01L 29/785; H01L 21/76883; H01L 21/76849; H01L 21/76834
    See application file for complete search history.

(56) References Cited

U.S. PATENT DOCUMENTS

| | | |
|---|---|---|
| 2016/0148869 A1 | 5/2016 | Schenker et al. |
| 2017/0040214 A1 | 2/2017 | Lai et al. |
| 2017/0365478 A1 | 12/2017 | George et al. |

OTHER PUBLICATIONS

International Preliminary Report on Patentability for International Patent Application No. PCT/US2018/024294, dated Oct. 8, 2020, 6 pgs.

\* cited by examiner

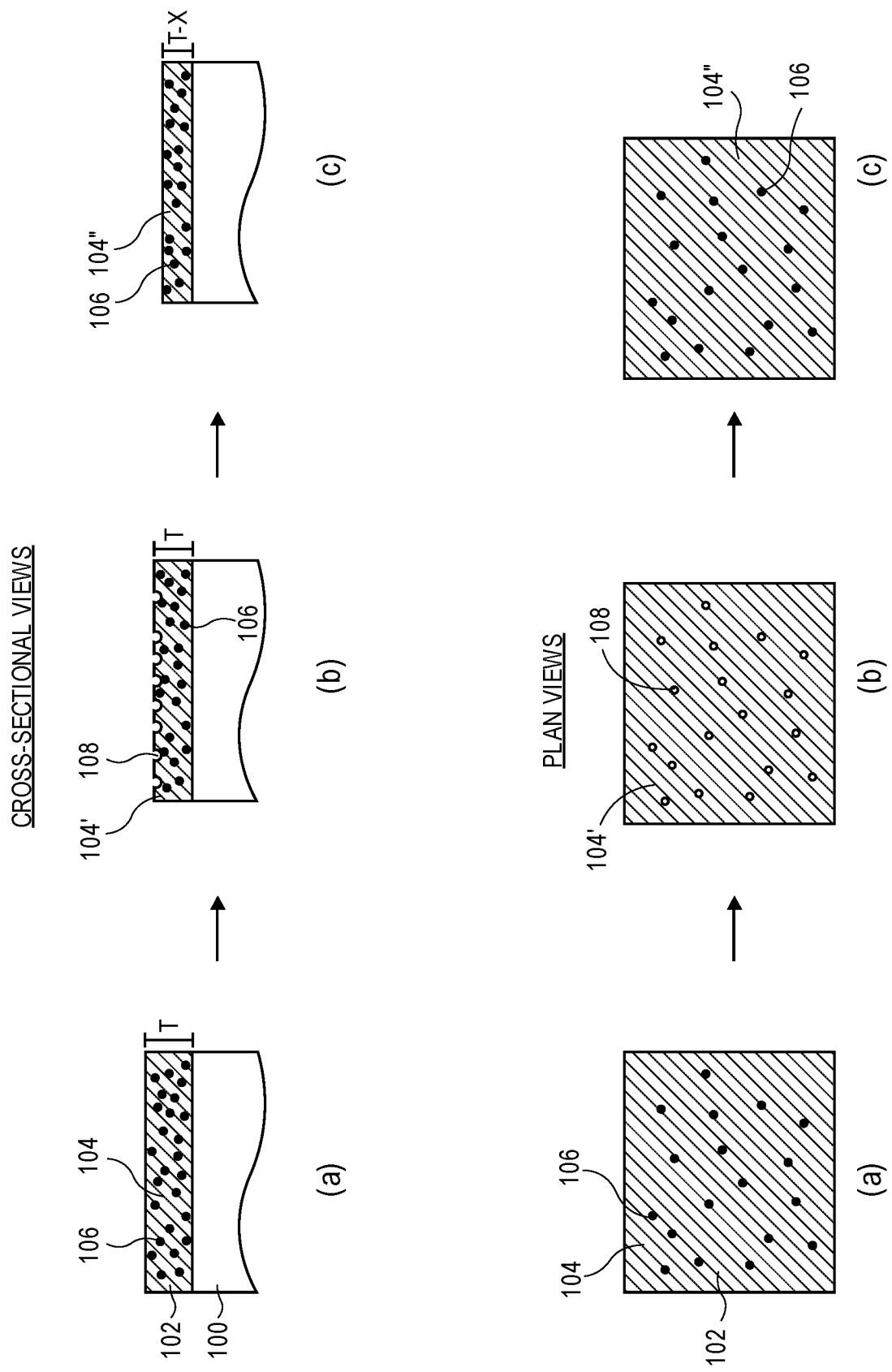

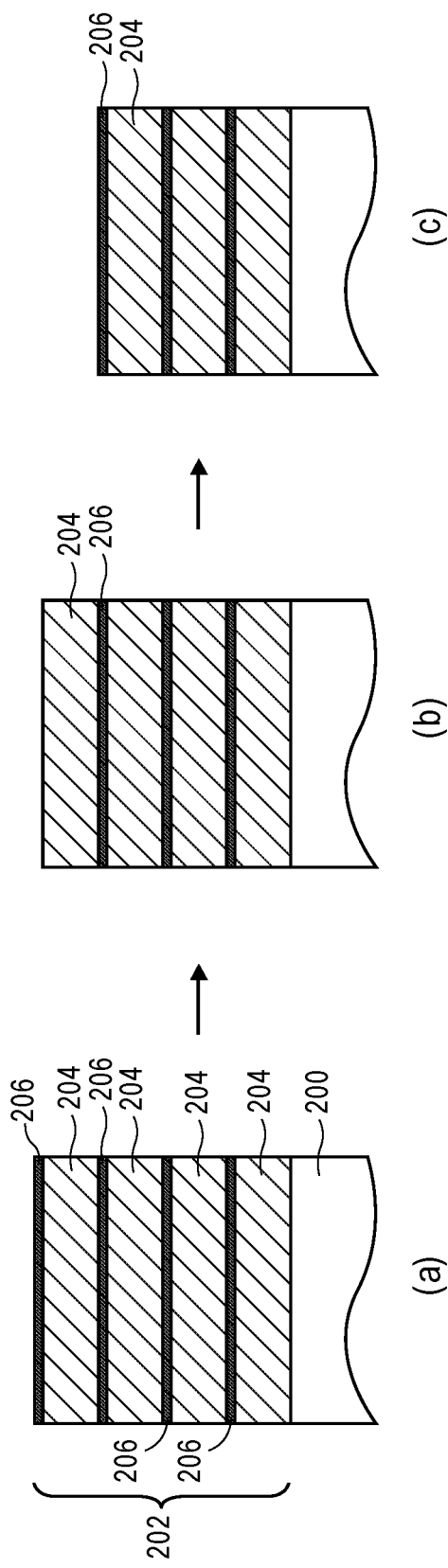
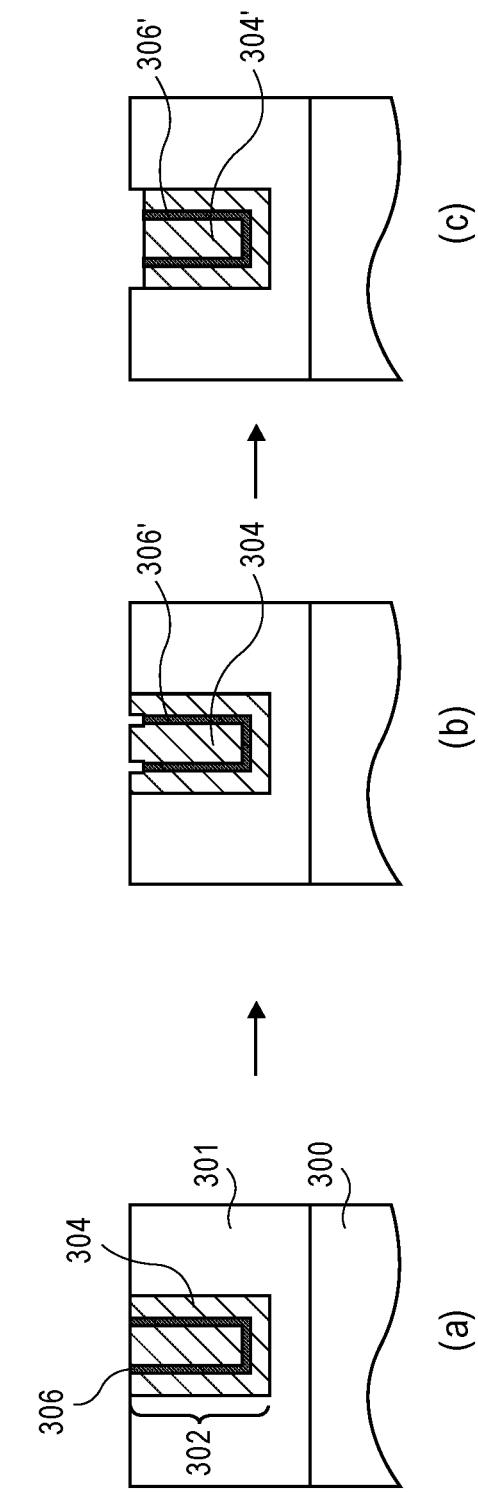

SELECTIVE ETCHING AND CONTROLLED ATOMIC LAYER ETCHING OF TRANSITION METAL OXIDE FILMS FOR DEVICE FABRICATION

CROSS-REFERENCE TO RELATED APPLICATION

This patent application is a U.S. National Phase Application under 35 U.S.C. § 371 of International Application No. PCT/US2018/024294, filed Mar. 26, 2018, entitled "SELECTIVE ETCHING AND CONTROLLED ATOMIC LAYER ETCHING OF TRANSITION METAL OXIDE FILMS FOR DEVICE FABRICATION," which designates the United States of America, the entire disclosure of which is hereby incorporated by reference in its entirety and for all purposes.

TECHNICAL FIELD

Embodiments of the disclosure are in the field of semiconductor structures and processing and, in particular, selective etching and controlled atomic layer etching of transition metal oxide films for device fabrication, and the resulting devices.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips.

In a first aspect, integrated circuits commonly include electrically conductive microelectronic structures, which are known in the art as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

One challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up. Thus, improvements are needed in the area of via and related interconnect manufacturing technologies.

In a second aspect, multi-gate transistors, such as tri-gate transistors, have become more prevalent as device dimensions continue to scale down. In conventional processes, tri-gate or other non-planar transistors are generally fabricated on either bulk silicon substrates or silicon-on-insulator substrates. In some instances, bulk silicon substrates are preferred due to their lower cost and compatibility with the existing high-yielding bulk silicon substrate infrastructure. Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming. Thus, improvements are needed in the area of non-planar transistor manufacturing technologies.

BRIEF DESCRIPTION OF THE DRAWINGS

FIG. 1 illustrates cross-sectional views and corresponding plan views of operations in a controlled etching scheme of a transition metal oxide film, in accordance with an embodiment of the present disclosure.

FIG. 2 illustrates cross-sectional views of operations in a controlled etching scheme of a transition metal oxide film, in accordance with another embodiment of the present disclosure.

FIG. 3 illustrates cross-sectional views of operations in a controlled etching scheme of a transition metal oxide film, in accordance with another embodiment of the present disclosure.

DESCRIPTION OF THE EMBODIMENTS

Figure 4A:
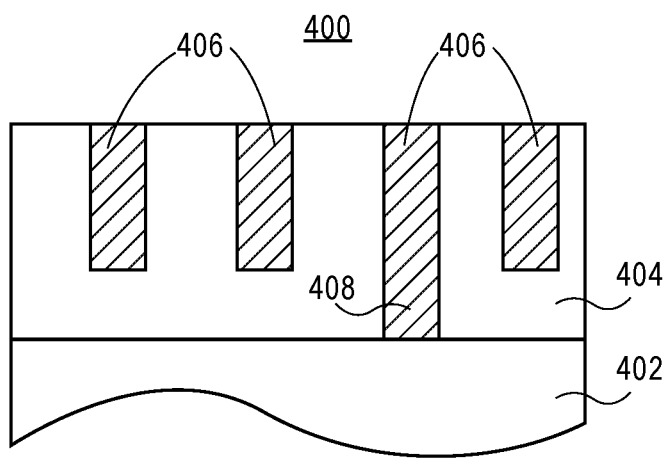
FIGS. 4A-4F illustrate cross-sectional views of portions of integrated circuit layers representing various operations in a method involving self-aligned conductive via formation for back end of line (BEOL) interconnect fabrication, in accordance with an embodiment of the present disclosure.

Selective etching and controlled atomic layer etching of transition metal oxide films for device fabrication, and the resulting devices, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be understood that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top"

refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to selective etching and controlled atomic layer etching of metal oxide films. Embodiments may be directed to one or more of selective etching and controlled atomic layer etching of metal oxide films, atomic layer deposition, atomic layer etching, etch selectivity, metal oxide, and latent porosity provides depth control for etching. Embodiments described herein may be implemented to enable new integration schemes requiring multi-color dielectrics, examples of which are described herein.

To provide context, new integration schemes for integrated circuit manufacture can require that a diversity of dielectric materials be present (e.g., at a given layer) with selective etching necessary to remove/recess one material in the presence of another. However, selective etching of similar materials, such as $HfO_2$ relative to $ZrO_2$, or other similar combinations may not be readily achieved since such pairing of materials can be very similar in etch properties.

In accordance with one or more embodiments of the present disclosure, selective etching of similar metal oxide films in flat regions and in features is achieved through intermixing one of the metal oxide films with a more or less etchable component, such as a second oxide species which may be an oxide or metal oxide that is not a transition metal oxide. Such an intermixed metal oxide, or co-oxide, may be generated during vapor phase deposition of one of the metal oxides, such as by atomic layer deposition (ALD) or chemical vapor deposition (CVD). The co-oxide component can be interspersed in various ways in a transition metal oxide film, examples of which are described below in association with FIGS. 1-3.

In accordance with an embodiment of the present disclosure, the etch characteristics of a transition metal oxide film are altered by introducing a co-oxide into the transition metal oxide film. An etch process may be selected which first targets the removal co-oxide. As co-oxide removed, surrounding metal oxide material is rendered more etchable. Additionally, the inclusion of co-oxides may provide an opportunity to tune the dielectric properties of the transition metal oxide film.

In some embodiments, in addition to selective etching, approaches described herein can be utilized to control "atomic" layer etching of metal oxides. For example, with reference to FIG. 2 described in greater detail below, a co-oxide can be used as an etch stop layer allowing removal of metal oxide material from above but then inhibiting further etching unless so desired. In other embodiments, a deposition process may be modified to deliver a thin layer of metal nitride to provide differentiation in etch selectivity. In such a case, a nitride of a same metal as the transition metal oxide may be used in a deposition process requiring only one metal precursor and switching between co-reactants (e.g., to form a $TiO_2$/TiN pairing, or a $Ta_2O_5$/TaN pairing).

In a first example, FIG. 1 illustrates cross-sectional views and corresponding plan views of operations in a controlled etching scheme of a transition metal oxide film, in accordance with an embodiment of the present disclosure.

Referring to part (a) of FIG. 1, a method of dry etching a film 102 on or above a substrate 100 includes forming a transition metal oxide film 104 having a latent pore-forming material 106 therein. In an embodiment, as depicted in FIG. 1, the latent pore-forming material 106 is dispersed randomly within the transition metal oxide film 104. The film 102 has a thickness (T).

In an embodiment, the transition metal oxide film 104 having the latent pore-forming material 106 therein is formed by co-reacting oxide precursors during a vapor phase deposition process. In an embodiment, the transition metal oxide film 104 includes a transition metal oxide material selected from the group consisting of hafnium oxide, zirconium oxide, titanium oxide, niobium oxide and tantalum oxide. In an embodiment, the latent pore-forming material 106 includes a material selected from the group consisting of aluminum oxide, gallium oxide, tin oxide, cobalt oxide, nickel oxide and silicon oxide. In an embodiment, the latent pore-forming material 106 makes up between 10 percent and 25 percent of a total volume of the transition metal oxide film 104 (i.e., between 10 percent and 25 percent of a total volume of film 102).

Referring to part (b) of FIG. 1, a surface portion of the latent pore-forming material 106 of the transition metal oxide film 104 is removed to form a porous region 108 of the transition metal oxide film 104, e.g., to form modified transition metal oxide film 104'.

Referring to part (c) of FIG. 1, the porous region 108 of the modified transition metal oxide film 104' is removed, e.g., to form partially etched transition metal oxide film 104" having a thickness reduced by an etched amount (X), i.e., having a thickness of T-X. It is to be appreciated that the processes of operations (b) and (c) may be repeated until a desired thickness of the film 102 is removed.

In an embodiment, for etchants that readily etch latent pore-forming material 106 (also referred to herein as a co-oxide), the surface portion of the latent pore-forming material 106 represents weak points in film 102 which will be selectively digested when in contact with etchant. As the co-oxide is removed, the remaining porous metal oxide (e.g., having region 108) is also removed at higher rate than the underlying dense metal oxide since there is greater contact with etchant and increased access points to metal centers of the transition metal oxide film.

In an embodiment, removal of the surface portion of the latent pore-forming material 106 is performed in a first etch process, and removal of the porous region 108 of the transition metal oxide film 104 is performed in a second, different, etch process. In another embodiment, removal of the surface portion of the latent pore-forming material 106 is performed in a first etch process, and removal of the porous region 108 of the transition metal oxide film 104 is performed in a same etch process. In an embodiment, removal of the surface portion of the latent pore-forming material 106 and removal of the porous region 108 of the transition metal oxide film 104 are performed using one or more plasma etch processes.

In a second example, FIG. 2 illustrates cross-sectional views of operations in a controlled etching scheme of a transition metal oxide film, in accordance with another embodiment of the present disclosure.

Referring to part (a) of FIG. 2, a method of dry etching a film 202 on or above a substrate 200 includes forming alternating layers of a transition metal oxide film 204 and a latent pore-forming material 206 there between. In an embodiment, as depicted in FIG. 2, the latent pore-forming material 206 is dispersed as one or more stacked planar layers within the transition metal oxide film 204.

Referring to part (b) of FIG. 2, a surface layer of the latent pore-forming material 206 is removed to expose an underlying layer of transition metal oxide film 204. Referring to part (c) of FIG. 2, the exposed underlying layer of transition metal oxide film 204 is removed to expose a next layer of the latent pore-forming material 206. In an embodiment, the next layer of the latent pore-forming material 206 is effectively an etch stop, providing a very controlled removal of only the uppermost layer of transition metal oxide film 204. It is to be appreciated that the processes of operations (b) and (c) may be repeated until a desired thickness of the film 202 is removed.

In a third example, FIG. 3 illustrates cross-sectional views of operations in a controlled etching scheme of a transition metal oxide film, in accordance with another embodiment of the present disclosure.

Referring to part (a) of FIG. 3, a method of dry etching a film 302 in a dielectric layer 301 on or above a substrate 300 includes forming alternating layers of a transition metal oxide film 304 and a latent pore-forming material 306 there between (one layer 306 is shown for ease of illustration in FIG. 3). In an embodiment, as depicted in FIG. 3, the latent pore-forming material 306 is dispersed as a conformal layer within the transition metal oxide film 304.

Referring to part (b) of FIG. 3, a surface portion of the latent pore-forming material 306 is removed to effectively form a porous upper region of the transition metal oxide film 304, and to form a recessed latent pore-forming material 306'. Referring to part (c) of FIG. 3, the porous upper region of the transition metal oxide film 304 is removed to provide a recessed transition metal oxide film 304'. It is to be appreciated that the processes of operations (b) and (c) may be repeated until a desired thickness of the film 302 is removed.

With respect to implementations of the etching schemes described herein, it is to be appreciated that as traditional scaling continues, e.g., the shrinkage of critical dimensions below 14 nanometers, the need to control the manufacture of features at the sub-nanometer level becomes essential. Film stacks are now routinely approaching thicknesses of less than 2-3 nanometers in many applications, making necessary the adoption of atomic precise techniques such as atomic layer etching. In particular, the efficient etch and removal of transition metal oxides in semiconductor processing is becoming increasingly important as more of these elements are incorporated with every passing technology node.

Three exemplary implementations of transition metal oxide film etching are described below as first, second and third aspects of embodiments of the present disclosure. It is to be appreciated that the three exemplary implementations are by no means limiting for possible applications of the etching approaches described herein. Implementations may include, but are by no means limited to, advanced transistor architectures.

In a first exemplary implementation, one or more embodiments are directed to an approach for fabricating metal lines as well as associated conductive vias. Conductive vias or vias, by definition, are used to land on a previous layer metal pattern. In this vein, embodiments described herein enable a more robust interconnect fabrication scheme since constraints on lithography equipment is relaxed. Such an interconnect fabrication scheme can be used to save numerous alignment/exposures, and can be used to reduce total process operations and processing time otherwise required for patterning such features using conventional approaches. Other benefits may include improvements in yield, or the prevention of shorting to a wrong line. Embodiments may be implemented to provide improved via shorting margin by self-alignment with "coloring" through selective deposition, and subsequent directed self-assembly, e.g., for the 10 nm and smaller technology nodes.

In an exemplary approach using colored hardmask selection of conductive lines and conductive caps, FIGS. 4A-4F illustrate cross-sectional views of portions of integrated circuit layers representing various operations in a method involving self-aligned conductive via formation for back end of line (BEOL) interconnect fabrication, in accordance with an embodiment of the present disclosure.

Referring to FIG. 4A, a starting structure 400 is provided as a beginning point for fabricating a new metallization layer (e.g., a BEOL layer). The starting structure 400 includes an inter-layer dielectric (ILD) layer 404 disposed above a substrate 402. As described below, the ILD layer may be disposed above an underlying metallization layer formed above the substrate 402. Trenches are formed in the ILD layer 404 and are filled with a conductive layer or layers to provide conductive lines 406 (and, in some cases, corresponding conductive vias 408). In an embodiment, the trenches of conductive lines 406 are formed in the ILD layer 404 using a pitch division patterning process flow. It is to be appreciated that the following process operation described below may first involve pitch division, or may not. In either case, but particularly when pitch division is also used, embodiments may enable continued scaling of the pitch of metal layers beyond the resolution capability of state-of-the art lithography equipment.

Figure 4B:
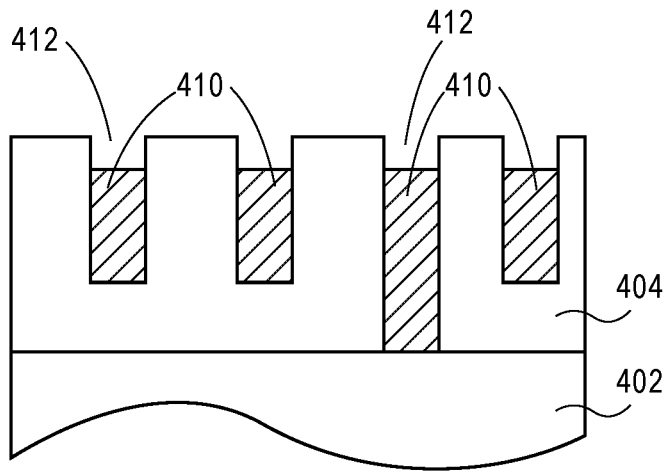

Referring to FIG. 4B, optionally, the conductive lines 406 are recessed below the upper surface of the ILD layer 404 to provide recessed conductive lines 410 having recess regions 412 above the recessed conductive lines 410. In an embodiment, the conductive lines 406 are recessed to form recessed conductive lines 410 using a selective wet etch process, such as a wet etch process based on sulfuric acid and hydrogen peroxide. In another embodiment, the conductive lines 406 are recessed to form recessed conductive lines 410 using a selective dry or plasma etch process.

Figure 4C:
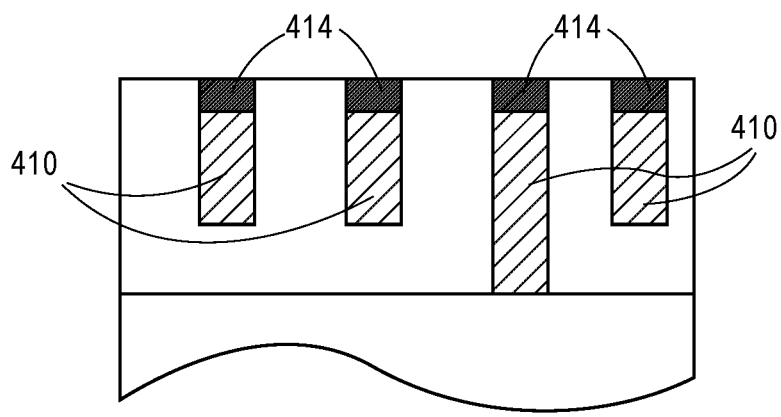

Referring to FIG. 4C, optionally, conductive caps 414 are formed in the recess regions 412 above the recessed conductive lines 410. In an embodiment, the conductive caps 414 are composed of a material that has more differentiated surface characteristics compared with the surface of ILD layer 404 than does the material of the conductive lines 406. In an embodiment, the conductive lines 406 include a copper fill material within a titanium nitride or tantalum nitride barrier liner, and the conductive caps 414 are composed of a metal such as, but not limited to, Al Pt, Ni, Ru, Pd, W, Ti, Ta, Ir, or Er, or alloys thereof. In another embodiment, Co, or an alloy of Co such as CoWB, is used. In an embodiment, at least a portion (e.g., a copper fill) of the conductive lines 406 is formed using electroplating process, and the conductive caps 414 are formed using a chemical vapor deposition (CVD) process, an atomic layer deposition (ALD) process, a physical vapor deposition (PVD) process, an e-beam evaporation process, an electroplating process, an electroless deposition process, or a spin-on process. In any case, in an embodiment, following deposition, the material of the conductive caps 414 is planarized, e.g., using chemical mechanical polishing (CMP), resulting in conductive caps 414 that are substantially co-planar with an uppermost surface of the ILD layer 404, as is depicted in FIG. 4C. As described herein, in an embodiment, metal cap formation is based on a recess, fill, CMP process. In another embodiment, cap deposition is achieved through selective deposition (e.g., in either recessed or non-recessed profiles). In another embodiment, cap formation is achieved through selective deposition.

It is to be appreciated that, aside from protecting the metal of recessed conductive lines 410 in subsequent processing steps, the conductive cap material may also aid the selective deposition of hardmask materials, particularly "color" hardmask materials. For example, Ru and W have been demonstrated to provide for an improved DSA brush grafting density as compared with cobalt. Furthermore, selective metal oxide deposition on Co with self-assembled monolayers (SAMs) may be challenging because of the tendency of cobalt to oxidize. In an embodiment, conductive caps 414 provide hermeticity during processing and reliability benefits in lieu of a conventional etch stop layer, in addition to facilitating pattern replication, as described below.

Figure 4D:
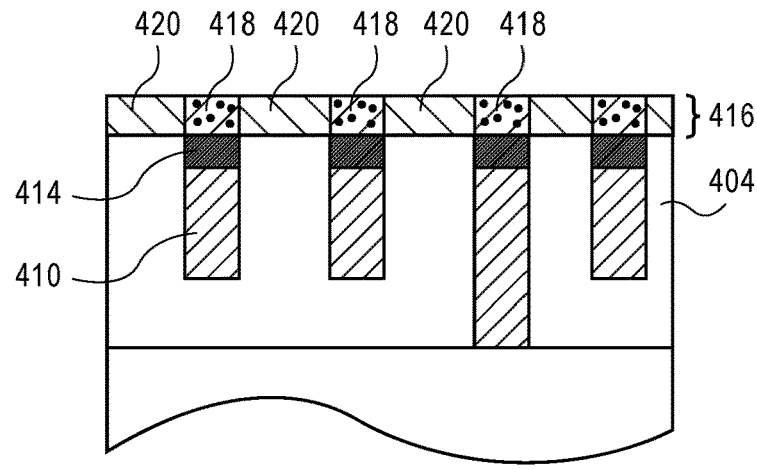

Referring to FIG. 4D, a hardmask layer 416 is formed over the structure of FIG. 4C. The hardmask layer 416 includes a first hardmask component 418 and a second hardmask component 420. The first hardmask component is formed on and in alignment with the conductive caps 414. The second hardmask component 420 is formed on and aligned with exposed surfaces of the ILD layer 404. In an embodiment, the hardmask layer 416 having first hardmask component 418 and second hardmask component 420 is formed using a directed self-assembly or selective deposition approach to ultimately form the two different, alternating regions of first hardmask component 418 and second hardmask component 420. In one such embodiment, the directed self-assembly or selective deposition approach is enhanced by the use of conductive caps 414 as opposed to using the surfaces of the conductive lines 406. In an embodiment, the materials of the first hardmask component 418 and second hardmask component 420 exhibit differing etch selectivity to one another. As described in greater detail below, directed self-assembly or selective growth can be used to align the first hardmask component 418 and second hardmask component 420 selectively to dielectric and metal surfaces, respectively.

In an embodiment, the first hardmask component 418 includes a transition metal oxide film having a latent pore-forming material (shown as dots) therein. In one embodiment, the transition metal oxide film includes a transition metal oxide material selected from the group consisting of hafnium oxide, zirconium oxide, titanium oxide, niobium oxide and tantalum oxide. In one embodiment, the latent pore-forming material includes a material selected from the group consisting of aluminum oxide and silicon oxide. In an embodiment, the transition metal oxide film having the latent pore-forming material therein is formed using co-reacted vapor deposition, as described above.

In an embodiment, the first hardmask component 418 is confined to the uppermost surface (e.g., the conductive caps 414) of the plurality of conductive lines 410, as is depicted in FIG. 4D. In another embodiment (not shown), the first hardmask component 418 extends onto a portion of the uppermost surface of the ILD layer 404.

In a first general embodiment, in order to ultimately form first hardmask component 418 and second hardmask component 420, a direct self-assembly (DSA) block co-polymer deposition and polymer assembly process is performed. In an embodiment, a DSA block co-polymer is coated on the surface and annealed to segregate the polymer into first blocks and second blocks. In one embodiment, the first polymer blocks preferentially attaches to the exposed surfaces of the ILD layer 404. The second polymer blocks adhere to the conductive caps 414. In an embodiment, the second and first block polymers are each sequentially replaced with the materials of the first hardmask component 418 and second hardmask component 420, respectively. In one such embodiment, selective etching and deposition processes are used to replace the second and first block polymers with the materials of the first hardmask component 418 and second hardmask component 420, respectively.

In a second general embodiment, in order to ultimately form first hardmask component 418 and second hardmask component 420, a selective growth process is instead of a DSA approach. In one such embodiment, the material of the second hardmask component 420 is grown above exposed portions of the ILD layer 404. A second, different, material of the first hardmask component 418 is grown above the conductive caps 414. In an embodiment, the selective growth is achieved by a dep-etch-dep-etch approach for both of the materials of the first hardmask component 418 and second hardmask component 420, resulting in a plurality of layers of each of the materials. Such an approach may be favorable versus conventional selective growth techniques which can form "mushroom-top" shaped films. The mushroom topping film growth tendency can be reduced through an alternating deposition/etch/deposition (dep-etch-dep-etch) approach. In another embodiment, a film is deposited selectively over the metal followed by a different film selectively over the ILD (or vice versa) and repeated numerous times creating a sandwich-like stack. In another embodiment, both materials are grown simultaneously in a reaction chamber (e.g., by a CVD style process) that grows selectively on each exposed region of the underlying substrate.

As described in greater detail below, in an embodiment, the resulting structure of FIG. 4D enables improved via shorting margins when fabricating later via layers on the structure of FIG. 4D. In one embodiment, improved shorting margin is achieved since fabricating a structure with alternating "color" hardmask components reduces the risk of a via shorting to the wrong metal line. In one embodiment, self-alignment is achieved since the alternating color hardmask components are self-aligned to the alternating ILD layer 104 and conductive cap 414 surfaces beneath. In an embodiment, the first hardmask component 418 is confined to the conductive caps 414 of the plurality of conductive lines 410, as is depicted. In another embodiment (not shown), however, the first hardmask component 418 extends onto a portion of the uppermost surface of the ILD layer 404.

Figure 4E:
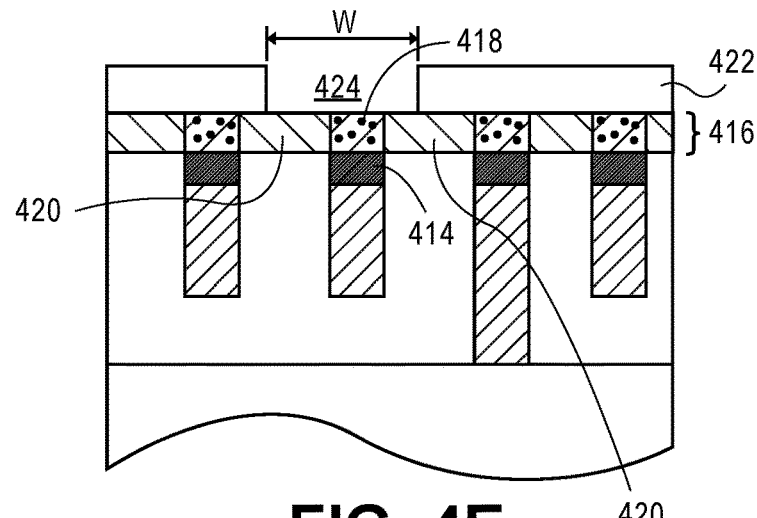

Referring to FIG. 4E, a second inter-layer dielectric (ILD) layer 422 is formed above the structure of FIG. 4D. An opening 424 is formed in the second ILD layer 422. In an embodiment, the opening 424 is formed in a location selected for conductive via fabrication for a next level metallization layer. In contrast to conventional via location selection, the opening 424 can, in one embodiment, have a relatively relaxed width as compared to the width of the corresponding conductive line 406 onto which the conductive via will ultimately be formed. For example, in a particular embodiment, the width (W) of the opening 424 has a dimension of approximately ¾ pitch of the conductive lines 406. Such an accommodation for a relatively wider via opening 424 can relax constraints on the lithography process used to form the opening 424. Additionally, tolerance for mis-alignment may be increased as well.

Figure 4F:
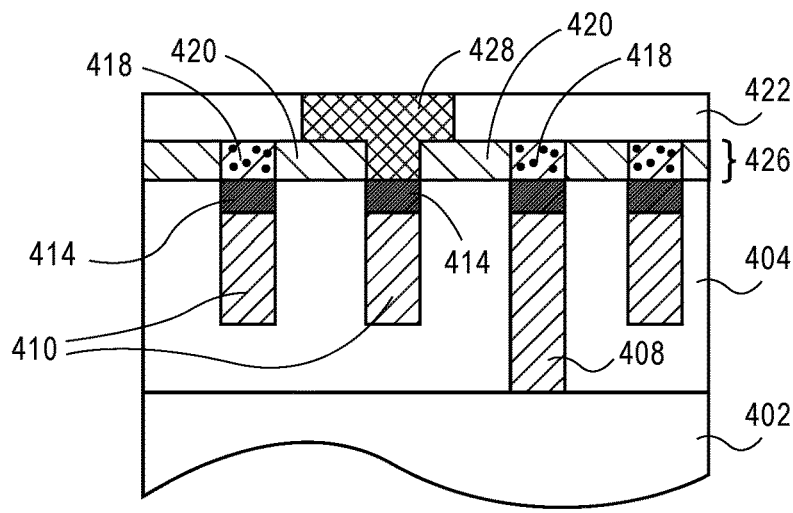

FIG. 4F illustrates the structure of FIG. 4E following next layer via fabrication. One of the first hardmask components 418 is selected for removal, e.g., by a selective transition metal oxide etch process such as a process described above in association with FIGS. 1-3. In this case, the exposed one of the first hardmask components 418 is removed selective to exposed portions of the second hardmask components 420.

A conductive via 428 is then formed in the opening 424 and in the region where the selected one of the first hardmask components 418 has been removed. The conductive via 428 electrically contacts a corresponding one of the conductive caps 414 of the recessed conductive lines 410. In an embodiment, the conductive via 428 electrically contacts the corresponding one of the conductive caps 414 of the recessed conductive lines 410 without shorting to one of the adjacent or neighboring conductive caps 414/recessed conductive line 410 pairings. In a specific embodiment, a portion of the conductive via 428 is disposed on one or more exposed portions of the second hardmask components 420, as is depicted in FIG. 4F. In an embodiment, an improved shorting margin is realized.

Referring again to FIG. 4F, in an exemplary illustrative embodiment, an integrated circuit structure includes a plurality of conductive lines 410 in an inter-layer dielectric (ILD) layer 404 above a substrate 402. Each of the plurality of conductive lines 410 is recessed relative to an uppermost surface of the ILD layer 404. A plurality of conductive caps 414 is on corresponding ones of the plurality of conductive lines 410, in recess regions above each of the plurality of conductive lines 410. A hardmask layer 426 is on the plurality of conductive caps 414 and on the uppermost surface of the ILD layer 404. The hardmask layer 426 includes a first hardmask component 418 on and aligned with the plurality of conductive caps 414. A second hardmask component 420 of the hardmask layer 426 is on an aligned with regions of the uppermost surface of the ILD layer 404. The first 418 and second 420 hardmask components differ in composition from one another, and the first hardmask component 418 includes a transition metal oxide film having a latent pore-forming material therein. A conductive via 428 is in an opening in the hardmask layer 426 and on a conductive cap 414 of one of the plurality of conductive lines 410. A portion of the conductive via 428 is on a portion of the second hardmask component 420 of the hardmask layer 426.

In an embodiment, the plurality of conductive caps 414 has an uppermost surface substantially co-planar with the uppermost surface of the ILD layer 404, as is depicted in FIG. 4F. In an embodiment, the first hardmask component 418 has an uppermost surface substantially co-planar with an uppermost surface of the second hardmask component 420, as is depicted in FIG. 4F. In an embodiment, the integrated circuit structure further includes a second ILD layer 422 above the hardmask layer 426. The conductive via 428 is further in an opening of the second ILD layer 422. In one such embodiment, the opening of the second ILD layer has a width approximately equal to ¾ pitch of the plurality of conductive lines 410. In an embodiment, one of the plurality of conductive lines 410 is coupled to an underlying conductive via structure 4108, as is depicted in FIG. 4F. In one such embodiment, the underlying conductive via structure 408 is connected to an underlying metallization layer of the integrated circuit structure (not depicted).

It is to be appreciated that the layers and materials described in association with FIGS. 4A-4F are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structure depicted in FIG. 4F may be fabricated on underlying lower level interconnect layers.

In an embodiment, as used throughout the present description, an interlayer dielectric (ILD) material is composed of or includes a layer of a dielectric or insulating material. Examples of suitable dielectric materials include, but are not limited to, oxides of silicon (e.g., silicon dioxide ($SiO_2$)), nitrides of silicon (e.g., silicon nitride ($Si_3N_4$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a barrier layer and a conductive fill material. In one embodiment, the barrier layer is a tantalum or tantalum nitride layer, or a combination thereof. In one embodiment, the conductive fill material is a material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, metal lines, or simply interconnect.

Patterned features may be patterned in a grating-like pattern with lines, holes or trenches spaced at a constant pitch and having a constant width. The pattern, for example, may be fabricated by a pitch halving or pitch quartering approach. In an example, a blanket film (such as a polycrystalline silicon film) is patterned using lithography and etch processing which may involve, e.g., spacer-based-quadruple-patterning (SBQP) or pitch quartering. It is to be appreciated that a grating pattern of lines can be fabricated by numerous methods, including 193 nm immersion lithography (i193), extreme ultra-violet (EUV) and/or electron-beam direct write (EBDW) lithography, directed self-assembly, etc. In other embodiments, the pitch does not need to be constant, nor does the width.

In a second aspect of the present disclosure, one or more embodiments are directed to approaches for, and structures formed from, landing a gate contact via directly on an active transistor gate. Such approaches may eliminate the need for extension of a gate line on isolation for contact purposes. Such approaches may also eliminate the need for a separate gate contact layer to conduct signals from a gate line or structure. In an embodiment, eliminating the above features is achieved by recessing contact metals in a trench contact and introducing an additional dielectric material in the process flow. The additional dielectric material is included as a trench contact dielectric cap layer with etch characteristics different from the gate dielectric material cap layer already used for trench contact alignment in a gate aligned contact process processing scheme.

Figure 5A:
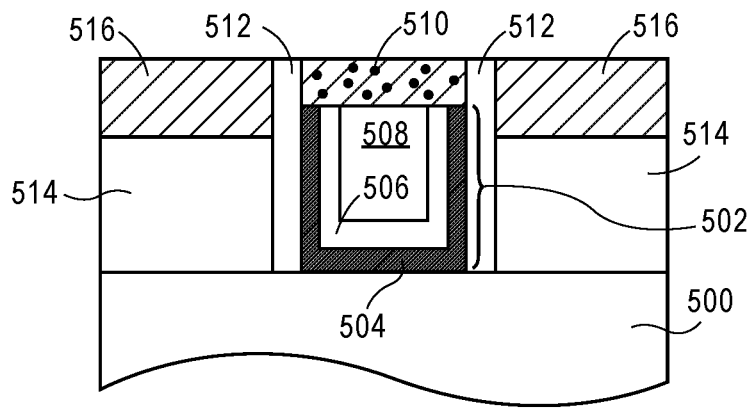
FIGS. 5A-5C illustrates selective etching of a gate electrode cap layer relative to a contact cap layer for self-aligned gate contact fabrication, in accordance with an embodiment of the present disclosure.
Figure 5B:
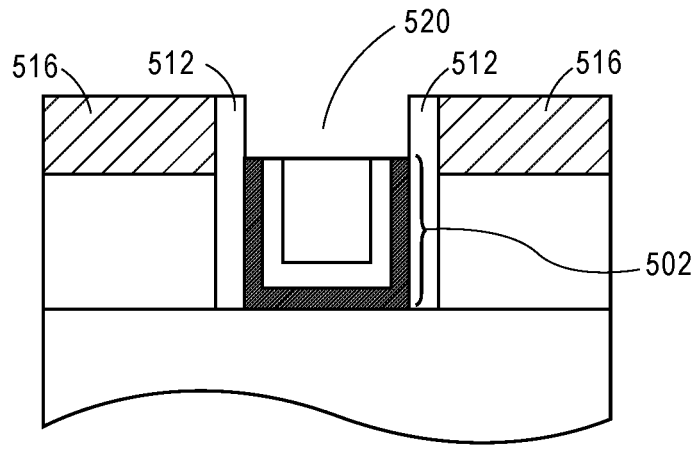
Figure 5C:
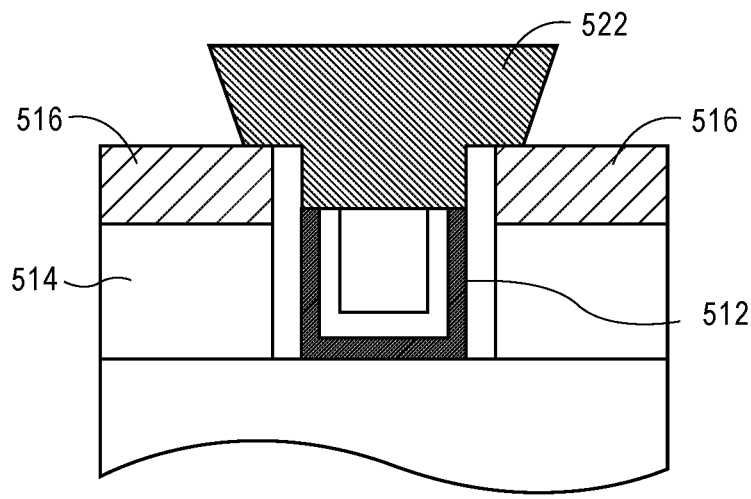

As an example, FIGS. 5A-5C illustrates selective etching of a gate electrode cap layer relative to a contact cap layer for self-aligned gate contact fabrication, in accordance with an embodiment of the present disclosure.

Referring to FIG. 5A, a gate stack 502 is formed on or above a substrate 500. First and second conductive trench contacts 514 are at first and second sides of the gate stack 502, respectively, with an optional dielectric spacer 512 formed there between. A first hardmask component 510 is formed on and aligned with an uppermost surface of the gate stack 502. A second hardmask component 516 is formed on and aligned with the first and second conductive trench contacts 514. The first 510 and second 516 hardmask components differ in composition from one another. In an embodiment, the first hardmask component 510 includes a transition metal oxide film having a latent pore-forming material therein. In an embodiment, the gate stack 502 includes a high-k gate dielectric layer 504, a workfunction gate electrode layer 506 and a conducive fill layer 508, as is depicted.

In an embodiment, the transition metal oxide film includes a transition metal oxide material selected from the group consisting of hafnium oxide, zirconium oxide, titanium oxide, niobium oxide and tantalum oxide. In an embodiment, the latent pore-forming material includes a material selected from the group consisting of aluminum oxide and silicon oxide.

Referring to FIG. 5B, the first hardmask component 510 is removed from over the gate electrode 502 to form an opening 520 above gate electrode 502. It is to be appreciated that the opening 520 may expose only a portion of the gate electrode 502, where portions of the gate electrode 502 into and out of the page of the perspective shown remain covered by remaining unetched portions of the first hardmask component 510. In an embodiment, the first hardmask component 510 is removed selective to the second hardmask component 516 and, if applicable, selective to the dielectric spacers 512.

Referring to FIG. 5C, a conductive via 522 is formed in the opening 520 in the first hardmask component and on a portion of the gate stack 502. In an embodiment, a portion of the conductive via 522 is on a portion of the second hardmask component 516, as is depicted.

Figure 6:
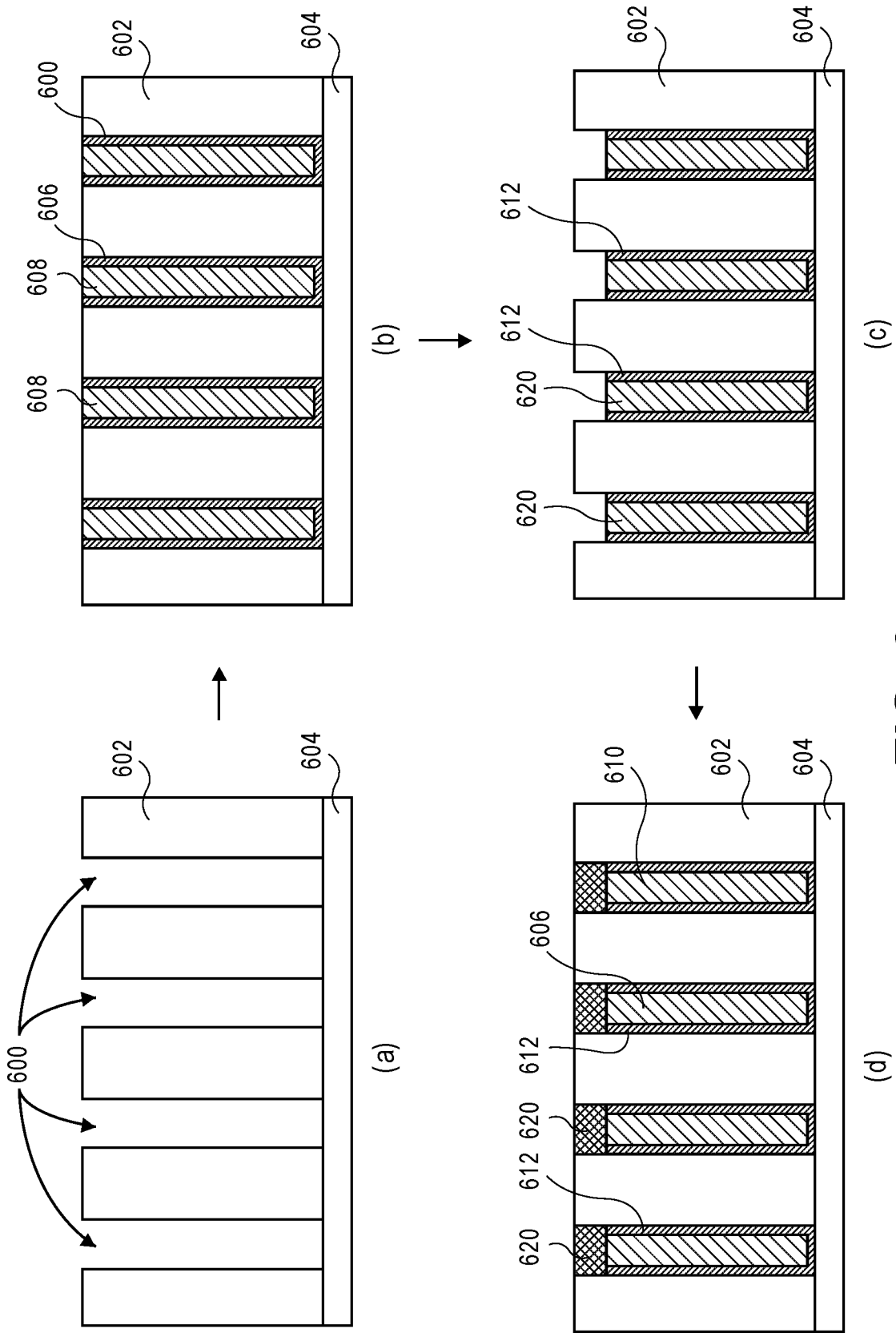
FIG. 6 illustrates various operations in a processing scheme using a transition metal oxide dry etch approach for gate electrode processing, in accordance with an embodiment of the present disclosure.

In a third aspect of the present disclosure, embodiments are directed to recessing of gate dielectric layers for, e.g., dielectric cap formation. FIG. 6 illustrates various operations in a processing scheme using a transition metal oxide dry etch approach for gate electrode processing, in accordance with an embodiment of the present disclosure.

Referring to part (a) of FIG. 6, a plurality of gate trenches 600 is formed in an insulating or dielectric layer 602 formed above a substrate 604. Referring to part (b) of FIG. 6, a transition metal oxide gate dielectric layer 606 is formed in the plurality of gate trenches 600. In an embodiment, the transition metal oxide gate dielectric layer 606 includes a transition metal oxide film having a latent pore-forming material therein. A gate electrode 608 is then formed on the transition metal oxide gate dielectric layer 606, as is also depicted in part (b) of FIG. 6. It is to be appreciated that the gate electrode 608 may be controlled to the level of the field, or the growth may be performed in excess and then planarized back (e.g., by a CMP process) during which transition metal oxide gate dielectric layer 606 formed on the field may also be removed.

Referring to part (c) of FIG. 6, partial recess of the gate electrode 608 and of the transition metal oxide gate dielectric layer 606 is performed to provide recessed gate electrode 610 and recessed transition metal oxide gate dielectric layer 612, respectively. In one such embodiment, the gate electrode 608 is first partially recessed selectively to the transition metal oxide gate dielectric layer 606. The transition metal oxide gate dielectric layer 608 is then partially recessed using a transition metal oxide dry etch approach such as described above in association with FIGS. 1-3. Referring to part (d) of FIG. 6, a dielectric cap layer 620 is then formed on the recessed gate electrode 610 and on the recessed transition metal oxide gate dielectric layer 612. Such a dielectric cap layer 620 may facilitate further processing and/or may be used to inhibit shorting between different conductive features, such as for self-aligned contact formation. As described in association with FIGS. 5A-5C, the dielectric cap layer 620 itself may be formed as a transition metal oxide film having a latent pore-forming material therein.

Figure 7A:
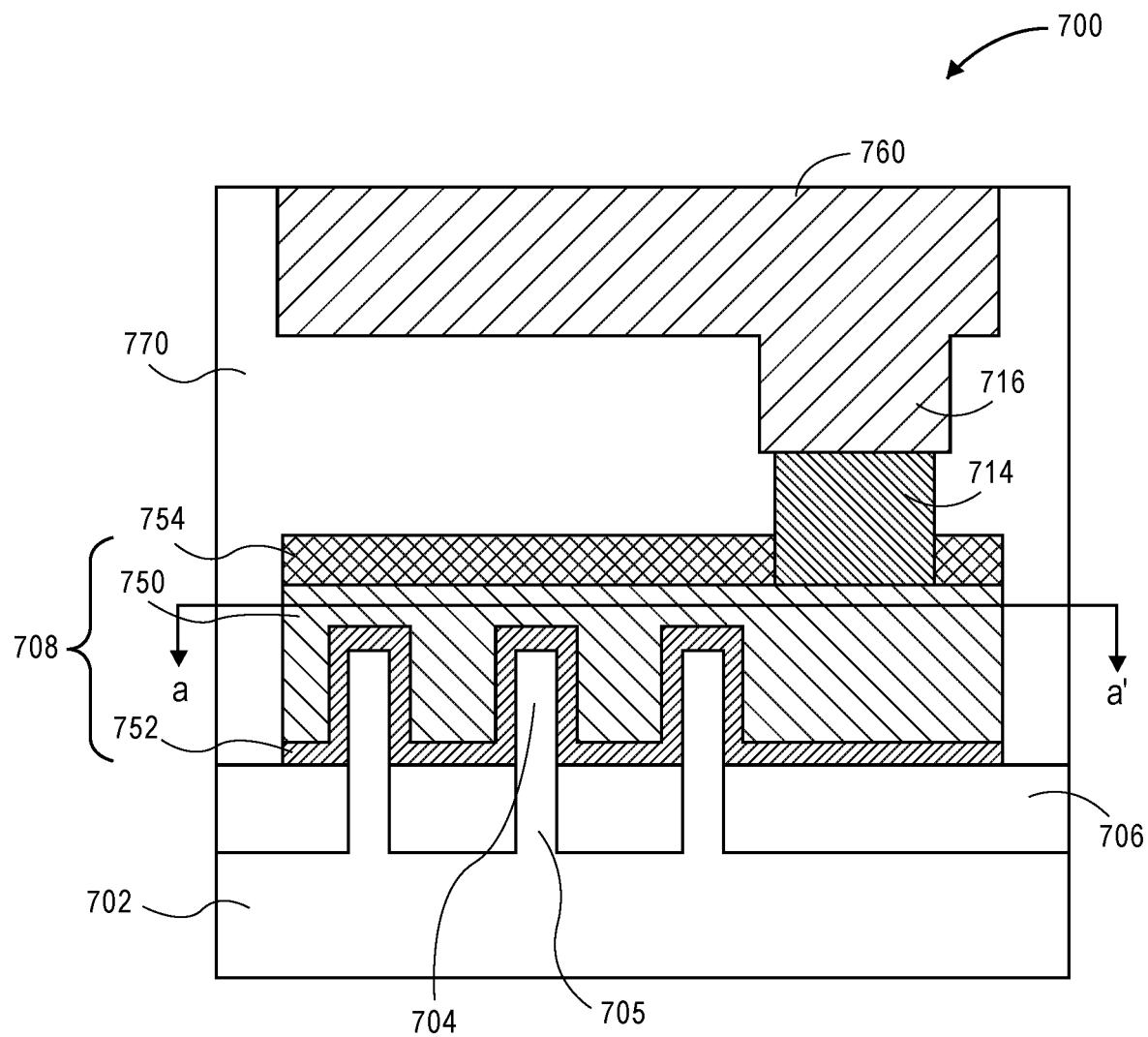
FIG. 7A illustrates a cross-sectional view of a non-planar semiconductor device, in accordance with an embodiment of the present disclosure.
Figure 7B:
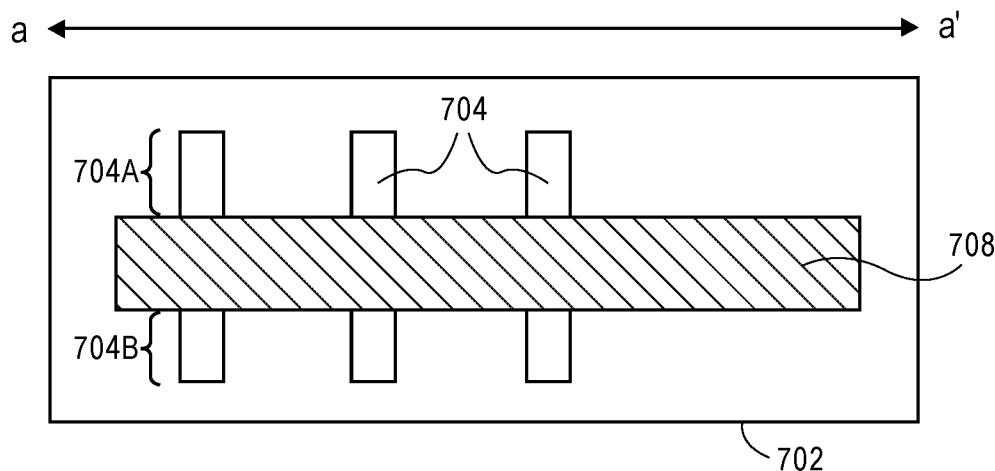
FIG. 7B illustrates a plan view taken along the a-a' axis of the semiconductor device of FIG. 7A, in accordance with an embodiment of the present disclosure.

One or more embodiments described herein are directed to fabricating semiconductor devices, such as for PMOS and NMOS device fabrication. For example, one or more features of a semiconductor device is formed using a using a transition metal oxide dry etch approach as described in association with FIGS. 1-3. As an example of a completed device, FIGS. 7A and 7B illustrate a cross-sectional view and a plan view (taken along the a-a' axis of the cross-sectional view), respectively, of a non-planar semiconductor device, in accordance with an embodiment of the present disclosure. As described below, transition metal oxide gate dielectric films can be recessed by using a transition metal oxide dry etch approach as described herein.

Referring to FIG. 7A, a semiconductor structure or device 700 includes a non-planar active region (e.g., a fin structure including protruding fin portion 704 and sub-fin region 705) formed from substrate 702, and within isolation region 706. A gate line 708 is disposed over the protruding portions 704 of the non-planar active region as well as over a portion of the isolation region 706. As shown, gate line 708 includes a gate electrode 750 and a gate dielectric layer 752. In one embodiment, gate line 708 may also include a dielectric cap layer 754. A gate contact 714, and overlying gate contact via 716 are also seen from this perspective, along with an gate contact 714, and overlying gate contact via 716, all of which are disposed in inter-layer dielectric stacks or layers 770. Also seen from the perspective of FIG. 7A, the gate contact 714 is, in one embodiment, disposed over isolation region 706, but not over the non-planar active regions. In an embodiment, the pattern of fins is a grating pattern.

In an embodiment, the dielectric cap layer 754 is formed after recessing at least a portion of the dielectric layer 752 using a transition metal oxide dry etch approach as described in association with FIGS. 1-3, where the dielectric layer 752 is or includes a transition metal oxide film having a latent pore-forming material therein. In a same or different embodiment, the dielectric cap layer 754 is formed from a transition metal oxide film having a latent pore-forming material therein.

Referring to FIG. 7B, the gate line 708 is shown as disposed over the protruding fin portions 704. Source and drain regions 704A and 704B of the protruding fin portions 704 can be seen from this perspective. In one embodiment, the source and drain regions 704A and 704B are doped portions of original material of the protruding fin portions 704. In another embodiment, the material of the protruding fin portions 704 is removed and replaced with another semiconductor material, e.g., by epitaxial deposition. In either case, the source and drain regions 704A and 704B may extend below the height of dielectric layer 706, i.e., into the sub-fin region 705.

In an embodiment, the semiconductor structure or device 700 is a non-planar device such as, but not limited to, a fin-FET or a tri-gate device. In such an embodiment, a corresponding semiconducting channel region is composed of or is formed in a three-dimensional body. In one such embodiment, the gate electrode stacks of gate lines 708 surround at least a top surface and a pair of sidewalls of the three-dimensional body. The concepts may be extended to gate all around devices such as nanowire based transistors.

Substrate 702 may be composed of a semiconductor material that can withstand a manufacturing process and in which charge can migrate. In an embodiment, substrate 702 is a bulk substrate composed of a crystalline silicon, silicon/germanium or germanium layer doped with a charge carrier, such as but not limited to phosphorus, arsenic, boron or a combination thereof, to form active region 704. In one embodiment, the concentration of silicon atoms in bulk substrate 702 is greater than 97%. In another embodiment, bulk substrate 702 is composed of an epitaxial layer grown atop a distinct crystalline substrate, e.g. a silicon epitaxial layer grown atop a boron-doped bulk silicon mono-crystalline substrate. Bulk substrate 702 may alternatively be composed of a group III-V material. In an embodiment, bulk substrate 702 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 702 is composed of a III-V material and the charge-carrier dopant impurity atoms are ones such as, but not limited to, carbon, silicon, germanium, oxygen, sulfur, selenium or tellurium.

Isolation region 706 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 706 is composed of a dielectric material such as, but not limited to, silicon dioxide, silicon oxy-nitride, silicon nitride, or carbon-doped silicon nitride.

Gate line 708 may be composed of a gate electrode stack which includes a gate dielectric layer 752 and a gate electrode layer 750. In an embodiment, the gate electrode of the gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 702. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 714 and overlying gate contact via 716 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material).

In an embodiment (although not shown), providing structure 700 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structure 708 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 700. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 7A, the arrangement of semiconductor structure or device 700 places the gate contact over isolation regions. Such an arrangement may be viewed as inefficient use of layout space. In another embodiment, however, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) or smaller technology node.

It is to be appreciated that both above described aspects of embodiments of the present disclosure could be applicable to front end or back end processing technologies. Furthermore, embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
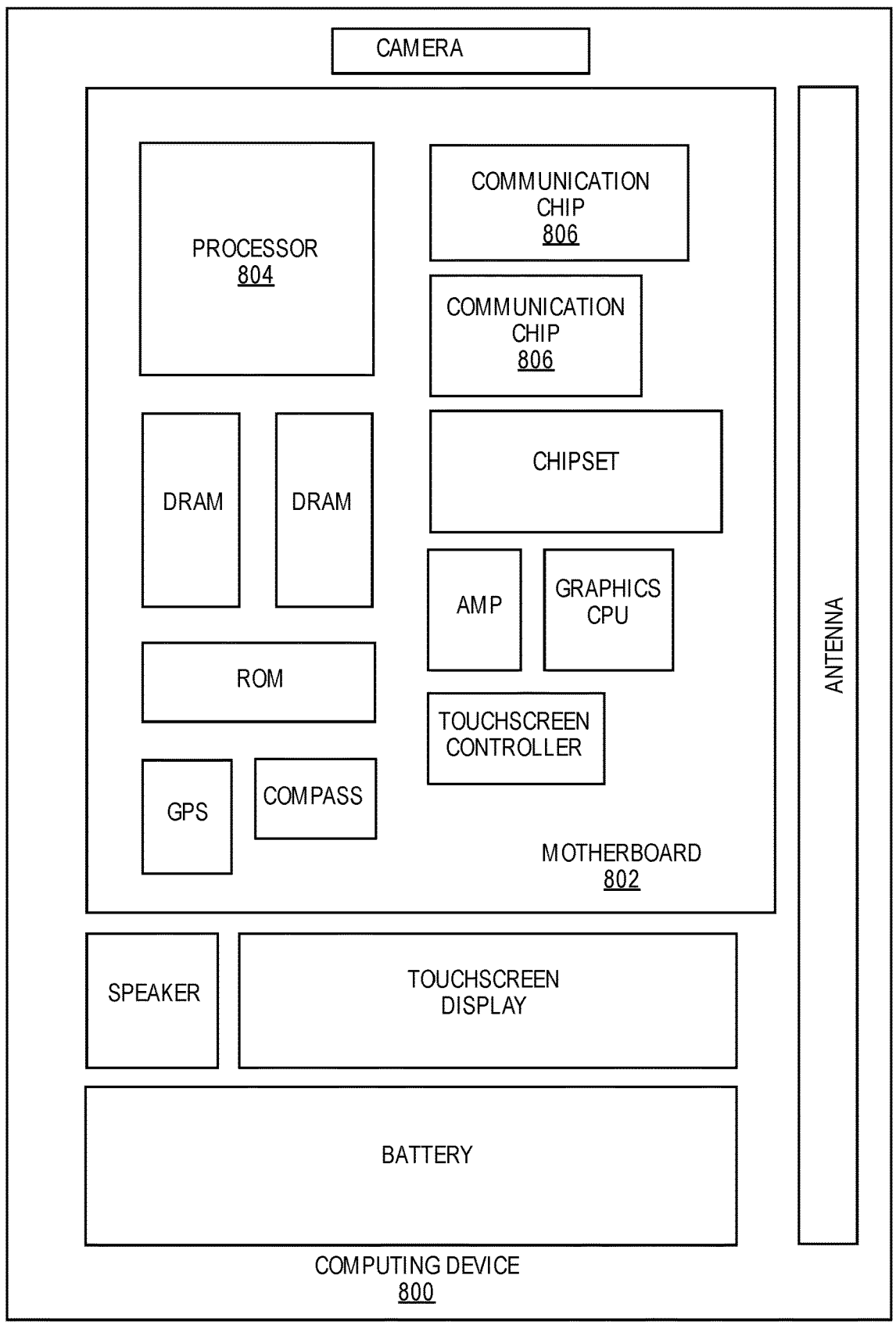
FIG. 8 illustrates a computing device in accordance with one implementation of the disclosure.

FIG. 8 illustrates a computing device 800 in accordance with one implementation of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the disclosure, the integrated circuit die of the processor includes one or more features fabricated using selective metal oxide etching, as built in accordance with implementations of the disclosure. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with an embodiment of the present disclosure, the integrated circuit die of the communication chip includes one or more features fabricated using selective metal oxide etching, as built in accordance with implementations of the disclosure.

In further implementations, another component housed within the computing device 800 may contain an integrated circuit die that includes one or more features fabricated using selective metal oxide etching, as built in accordance with implementations of the disclosure.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
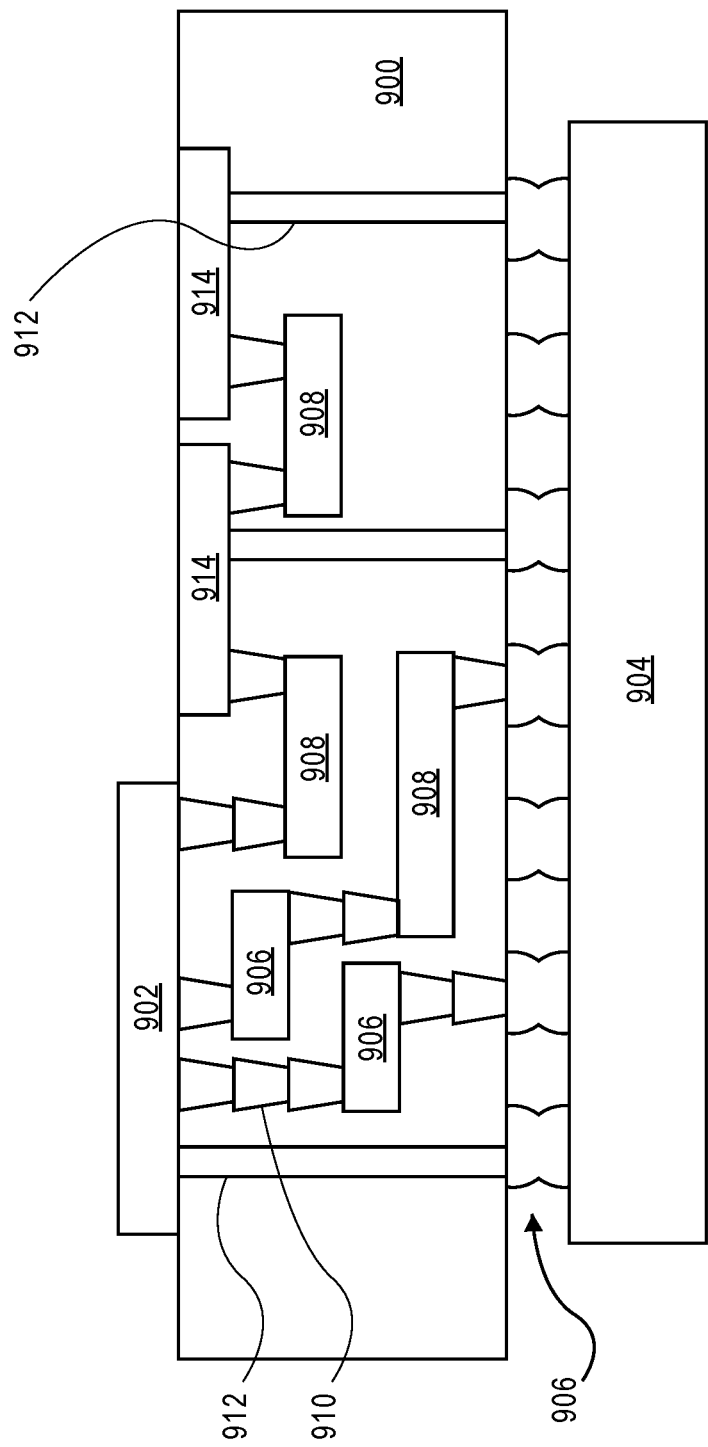
FIG. 9 is an interposer implementing one or more embodiments of the disclosure.

FIG. 9 illustrates an interposer 900 that includes one or more embodiments of the disclosure. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the disclosure, apparatuses or processes disclosed herein may be used in the fabrication of interposer 900 or in the fabrication of components included in interposer 900.

Thus, embodiments of the present disclosure include selective etching and controlled atomic layer etching of transition metal oxide films for device fabrication, and the resulting devices.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: A method of dry etching a film includes forming a transition metal oxide film having a latent pore-forming material therein. The method also includes removing a surface portion of the latent pore-forming material of the transition metal oxide film to form a porous region of the transition metal oxide film. The method also includes removing the porous region of the transition metal oxide film.

Example embodiment 2: The method of example embodiment 1, wherein the removing the surface portion of the latent pore-forming material is performed in a first etch process, and the removing the porous region of the transition metal oxide film is performed in a second, different, etch process.

Example embodiment 3: The method of example embodiment 1, wherein the removing the surface portion of the latent pore-forming material and the removing the porous region of the transition metal oxide film are performed in a same etch process.

Example embodiment 4: The method of example embodiment 1, 2 or 3, wherein the removing the surface portion of the latent pore-forming material and the removing the porous region of the transition metal oxide film are performed using one or more plasma etch processes.

Example embodiment 5: The method of example embodiment 1, 2, 3 or 4, wherein forming the transition metal oxide film having the latent pore-forming material therein includes co-reacting oxide precursors during a vapor phase deposition process.

Example embodiment 6: The method of example embodiment 1, 2, 3, 4 or 5, wherein the transition metal oxide film includes a transition metal oxide material selected from the group consisting of hafnium oxide, zirconium oxide, titanium oxide, niobium oxide and tantalum oxide.

Example embodiment 7: The method of example embodiment 1, 2, 3, 4, 5 or 6, wherein the latent pore-forming material includes a material selected from the group consisting of aluminum oxide and silicon oxide.

Example embodiment 8: The method of example embodiment 1, 2, 3, 4, 5, 6 or 7, wherein the latent pore-forming material includes between 10 percent and 25 percent of a total volume of the transition metal oxide film.

Example embodiment 9: The method of example embodiment 1, 2, 3, 4, 5, 6, 7 or 8, wherein the latent pore-forming material is dispersed randomly within the transition metal oxide film.

Example embodiment 10: The method of example embodiment 1, 2, 3, 4, 5, 6, 7 or 8, wherein the latent pore-forming material is dispersed as one or more stacked planar layers within the transition metal oxide film.

Example embodiment 11: The method of example embodiment 1, 2, 3, 4, 5, 6, 7 or 8, wherein the latent pore-forming material is dispersed as one or more conformal layers within the transition metal oxide film.

Example embodiment 12: An integrated circuit structure includes a plurality of conductive lines in an inter-layer dielectric (ILD) layer above a substrate. A hardmask layer is on the plurality of conductive lines and on an uppermost surface of the ILD layer. The hardmask layer includes a first hardmask component on and aligned with the uppermost surface of the plurality of conductive lines, and a second hardmask component on and aligned with regions of the uppermost surface of the ILD layer. The first and second hardmask components differ in composition from one another. The first hardmask component includes a transition metal oxide film having a latent pore-forming material therein. A conductive via is in an opening in the hardmask layer and on a portion of one of the plurality of conductive lines.

Example embodiment 13: The integrated circuit structure of claim 12, wherein the transition metal oxide film includes a transition metal oxide material selected from the group consisting of hafnium oxide, zirconium oxide, titanium oxide, niobium oxide and tantalum oxide.

Example embodiment 14: The integrated circuit structure of claim 12 or 13, wherein the latent pore-forming material includes a material selected from the group consisting of aluminum oxide, gallium oxide, tin oxide, cobalt oxide, nickel oxide and silicon oxide.

Example embodiment 15: The integrated circuit structure of claim 12, 13 or 14, wherein the first hardmask component is confined to the uppermost surface of the plurality of conductive lines.

Example embodiment 16: The integrated circuit structure of claim 12, 13 or 14, wherein the first hardmask component extends onto a portion of the uppermost surface of the ILD layer.

Example embodiment 17: The integrated circuit structure of claim 12, 13, 14, 15 or 16, wherein a portion of the conductive via is on a portion of the second hardmask component of the hardmask layer.

Example embodiment 18: The integrated circuit structure of claim 12, 13, 14, 15, 16 or 17, wherein the first hardmask component has an uppermost surface substantially co-planar with an uppermost surface of the second hardmask component.

Example embodiment 19: The integrated circuit structure of claim 12, 13, 14, 15, 16, 17 or 18, further including a second ILD layer above the hardmask layer, wherein the conductive via is further in an opening of the second ILD layer.

Example embodiment 20: The integrated circuit structure of claim 12, 13, 14, 15, 16, 17, 18 or 19, wherein one of the plurality of conductive lines is coupled to an underlying conductive via structure, the underlying conductive via structure connected to an underlying metallization layer of the integrated circuit structure.

Example embodiment 21: An integrated circuit structure includes a gate stack above a substrate. A first and a second conductive trench contact are at first and second sides of the gate stack, respectively. A first hardmask component is on and aligned with an uppermost surface of the gate stack. A second hardmask component is on and aligned with first and second conductive trench contacts. The first and second hardmask components differ in composition from one another. The first hardmask component includes a transition metal oxide film having a latent pore-forming material therein. A conductive via is in an opening in the first hardmask component and on a portion of the gate stack.

Example embodiment 22: The integrated circuit structure of example embodiment 21, wherein the transition metal oxide film includes a transition metal oxide material selected from the group consisting of hafnium oxide, zirconium oxide, titanium oxide, niobium oxide and tantalum oxide.

Example embodiment 23: The integrated circuit structure of example embodiment 21 or 22, wherein the latent pore-forming material includes a material selected from the group consisting of aluminum oxide and silicon oxide.

Example embodiment 24: The integrated circuit structure of example embodiment 21, 22 or 23, wherein a portion of the conductive via is on a portion of the second hardmask component.

What is claimed is:

1. A method of dry etching a film, the method comprising:
    forming a transition metal oxide film having a latent pore-forming material therein;
    removing a surface portion of the latent pore-forming material of the transition metal oxide film to form a porous region of the transition metal oxide film; and
    removing the porous region of the transition metal oxide film.

2. The method of claim 1, wherein the removing the surface portion of the latent pore-forming material is performed in a first etch process, and the removing the porous region of the transition metal oxide film is performed in a second, different, etch process.

3. The method of claim 1, wherein the removing the surface portion of the latent pore-forming material and the removing the porous region of the transition metal oxide film are performed in a same etch process.

4. The method of claim 1, wherein the removing the surface portion of the latent pore-forming material and the removing the porous region of the transition metal oxide film are performed using one or more plasma etch processes.

5. The method of claim 1, wherein forming the transition metal oxide film having the latent pore-forming material therein comprises co-reacting oxide precursors during a vapor phase deposition process.

6. The method of claim 1, wherein the transition metal oxide film comprises a transition metal oxide material selected from the group consisting of hafnium oxide, zirconium oxide, titanium oxide, niobium oxide and tantalum oxide.

7. The method of claim 6, wherein the latent pore-forming material comprises a material selected from the group consisting of aluminum oxide, gallium oxide, tin oxide, cobalt oxide, nickel oxide and silicon oxide.

8. The method of claim 1, wherein the latent pore-forming material comprises between 10 percent and 25 percent of a total volume of the transition metal oxide film.

9. The method of claim 1, wherein the latent pore-forming material is dispersed randomly within the transition metal oxide film.

10. The method of claim 1, wherein the latent pore-forming material is dispersed as one or more stacked planar layers within the transition metal oxide film.

11. The method of claim 1, wherein the latent pore-forming material is dispersed as one or more conformal layers within the transition metal oxide film.

12. An integrated circuit structure, comprising:
a plurality of conductive lines in an inter-layer dielectric (ILD) layer above a substrate;
a hardmask layer on the plurality of conductive lines and on an uppermost surface of the ILD layer, the hardmask layer comprising a first hardmask component on and aligned with the uppermost surface of the plurality of conductive lines, and a second hardmask component on and aligned with regions of the uppermost surface of the ILD layer, the first and second hardmask components differing in composition from one another, and the first hardmask component comprising a transition metal oxide film having a latent pore-forming material therein; and
a conductive via in an opening in the hardmask layer and on a portion of one of the plurality of conductive lines.

13. The integrated circuit structure of claim 12, wherein the transition metal oxide film comprises a transition metal oxide material selected from the group consisting of hafnium oxide, zirconium oxide, titanium oxide, niobium oxide and tantalum oxide.

14. The integrated circuit structure of claim 13, wherein the latent pore-forming material comprises a material selected from the group consisting of aluminum oxide and silicon oxide.

15. The integrated circuit structure of claim 12, wherein the first hardmask component is confined to the uppermost surface of the plurality of conductive lines.

16. The integrated circuit structure of claim 12, wherein the first hardmask component extends onto a portion of the uppermost surface of the ILD layer.

17. The integrated circuit structure of claim 12, wherein a portion of the conductive via is on a portion of the second hardmask component of the hardmask layer.

18. The integrated circuit structure of claim 12, wherein the first hardmask component has an uppermost surface substantially co-planar with an uppermost surface of the second hardmask component.

19. The integrated circuit structure of claim 12, further comprising:
a second ILD layer above the hardmask layer, wherein the conductive via is further in an opening of the second ILD layer.

20. The integrated circuit structure of claim 12, wherein one of the plurality of conductive lines is coupled to an underlying conductive via structure, the underlying conductive via structure connected to an underlying metallization layer of the integrated circuit structure.

21. An integrated circuit structure, comprising:
a gate stack above a substrate;
a first and a second conductive trench contact at first and second sides of the gate stack, respectively;
a first hardmask component on and aligned with an uppermost surface of the gate stack;
a second hardmask component on and aligned with first and second conductive trench contacts, the first and second hardmask components differing in composition from one another, and the first hardmask component comprising a transition metal oxide film having a latent pore-forming material therein; and
a conductive via in an opening in the first hardmask component and on a portion of the gate stack.

22. The integrated circuit structure of claim 21, wherein the transition metal oxide film comprises a transition metal oxide material selected from the group consisting of hafnium oxide, zirconium oxide, titanium oxide, niobium oxide and tantalum oxide.

23. The integrated circuit structure of claim 22, wherein the latent pore-forming material comprises a material selected from the group consisting of aluminum oxide and silicon oxide.

24. The integrated circuit structure of claim 21, wherein a portion of the conductive via is on a portion of the second hardmask component.

\* \* \* \* \*